(12) United States Patent
Hogan et al.

(10) Patent No.: US 11,705,676 B2
(45) Date of Patent: Jul. 18, 2023

(54) METHOD AND APPARATUS FOR TRACKING A LIFE CYCLE OF TURBOCHARGER

(71) Applicant: Caterpillar Inc., Peoria, IL (US)

(72) Inventors: Brian C. Hogan, Pittsboro, IN (US);
Thomas Jeffrey Crowell, Germantown Hills, IL (US); Jon Ashley Johnson, Flora, IN (US); Anurag Menon Kunnath, Peoria, IL (US); Martin A. Lehman, Congerville, IL (US); Marian Elizabeth L. Neal, Lafayette, IN (US); Vincent John Neyens, Peoria, IL (US); Joseph Brock Oelze, Peoria, IL (US); Tryg Carl Tow, Peoria, IL (US); Ross Wetzel, Peoria, IL (US)

(73) Assignee: Caterpillar Inc., Peoria, IL (US)

( * ) Notice: Subject to any disclaimer, the term of this patent is extended or adjusted under 35 U.S.C. 154(b) by 186 days.

(21) Appl. No.: 17/119,586

(22) Filed: Dec. 11, 2020

(65) Prior Publication Data
US 2022/0186659 A1 Jun. 16, 2022

(51) Int. Cl.
| H05K 1/02 | (2006.01) |
| H01R 13/66 | (2006.01) |
| H05K 7/20 | (2006.01) |
| H01R 13/622 | (2006.01) |

(52) U.S. Cl.
CPC ......... *H01R 13/665* (2013.01); *H01R 13/622* (2013.01); *H05K 7/2039* (2013.01); *H01R 2201/26* (2013.01)

(58) Field of Classification Search
CPC ............... H01R 13/665; H01R 13/622; H01R 2201/26; H05K 7/20; H05K 7/20154; H05K 7/2039; H05K 1/0203
See application file for complete search history.

(56) References Cited

U.S. PATENT DOCUMENTS

| 6,209,390 | B1 | 4/2001 | LaRue et al. | |
| 6,956,739 | B2 * | 10/2005 | Bunyan | H01L 23/4275 524/400 |
| 9,568,154 | B2 * | 2/2017 | Hansen | F21V 19/0045 |
| 9,693,481 | B2 * | 6/2017 | Timmerman | H01L 23/3737 |
| 10,541,156 | B1 * | 1/2020 | Interrante | H01L 23/3675 |
| 2015/0211951 | A1 | 7/2015 | Willis et al. | |
| 2015/0305603 | A1 * | 10/2015 | Gal | A61B 1/0669 600/109 |

FOREIGN PATENT DOCUMENTS

CN 108167067 6/2018

\* cited by examiner

*Primary Examiner* — Thanh Tam T Le
(74) *Attorney, Agent, or Firm* — Lee & Hayes, P.C.

(57) ABSTRACT

A plug configured to be at least partially inserted into a central housing of a turbocharger. The plug includes a body having a first end, a second end opposite the first end, and a threaded portion extending from the second end to a location on the body between the first end and the second end. The plug further includes a heat sink coupled to the second end, and a microchip mounted to a substrate that is coupled to the heat sink, the microchip configured to store information related to the turbocharger, wherein the microchip is at least partially submerged in coolant in the central housing when the plug is inserted into the central housing of the turbocharger.

19 Claims, 9 Drawing Sheets

METHOD AND APPARATUS FOR TRACKING A LIFE CYCLE OF TURBOCHARGER

TECHNICAL FIELD

The present disclosure relates to an apparatus for tracking engine components. More specifically, the present disclosure relates to a plug that is inserted into an engine component and includes a microchip configured to track events in a life cycle of the turbocharger.

BACKGROUND

Engine usage is often tracked and monitored by various devices. For example, engine hours, miles, or other parameters may be tracked and recorded by odometers, hour meters, engine control modules, or the like. From such engine usage information, an expected useable life of various components of an engine system can be determined. For example, engine system components often require maintenance, replacement, or other service after a usage service interval has lapsed, with the service interval being based on the engine usage information. Certain components such as filters, belts, fluids, chains, seals, gaskets etc. can be replaced once their specific service intervals have lapsed.

However, other components are typically serviced rather than replaced. This is due to various reasons including, but not limited to, the cost of the component or difficulty of accessing the component. For example, pumps, turbochargers, engine cylinder heads, or other components are often repaired or rebuilt instead of replacing the entire component. Since these components are not replaced on regular service intervals, it is difficult to track and monitor when such components are inspected, serviced, or repaired. As such, owners of such equipment can have difficulty determining whether proper maintenance has been maintained for such components. Furthermore, if such a component is repaired or rebuilt, a manufacturer is unable to determine whether the component has been rebuilt with the proper components without inspecting the component. As an example, while usage of a turbocharger may correspond with engine usage, in some situations, a turbocharger can be installed after an engine has been used for a period of time. Furthermore, a turbocharger may be installed to replace an originally equipped turbocharger and usage of the turbocharger will therefore not correspond with the engine usage. As such, current devices and methods are unable to track and monitor a life cycle of a turbocharger.

An example device for diagnosing a turbocharger is described in U.S. Patent Application No. 2015/0211951 (hereinafter referred to as the '951 application). In particular, the '951 application describes a radio frequency identification (RFID) circuit that is coupled to a turbocharger. The RFID circuit includes a mechanical link that is designed to change impedance as input from the turbocharger changes. The '951 application describes that various impedance levels correspond with different vibration levels, and indicates potential turbocharger degradation or failure at threshold amounts of impedance. The change in impedance is measurable by an RFID chip that sends a signal to an RFID reader within range of the RFID chip. The '951 application does not, however, describe a microchip configured to be inserted into a turbocharger central housing. For instance, as the '951 application describes using an RFID chip to transmit a signal to an RFID reader, the RFID chip is not placed in the central housing as the central housing and other components of the turbocharger would block signals sent from the RFID chip to the RFID reader. As a result, the system described in the '951 application is not optimized for reliably tracking and reporting use of the turbocharger during its life cycle. For example, the RFID circuit described in the '951 application is not thermally connected to coolant systems utilized by the turbocharger. As a result, the described system can be prone to failure caused by prolonged use in relatively high-temperature environments.

Example embodiments of the present disclosure are directed toward overcoming the deficiencies described above.

SUMMARY

An example plug is configured to be at least partially inserted into a central housing of a turbocharger. The plug includes a body having a first end, a second end opposite the first end, and a threaded portion extending from the second end to a location on the body between the first end and the second end. The plug further includes a heat sink coupled to the second end of the body, and a microchip coupled to the heat sink and configured to store information related to the turbocharger. The microchip is at least partially submerged in coolant in the central housing when the plug is inserted into the central housing of the turbocharger.

In a further example, a plug is configured to be at least partially insertable into a housing of an engine component. The plug includes a body including a first end and a second end opposite the first end and a microchip coupled to the second end of the body and configured to store information related to the engine component. The microchip is at least partially submerged in coolant in the housing when the plug is inserted into the housing of the engine component.

In another example, a turbocharger includes a central housing having at least one fluid passage directing a flow of coolant through the central housing, a turbine housing coupled to the central housing, and a compressor housing coupled to the central housing. The turbocharger further includes a plug coupled to the central housing, the plug including a body having a first end, a second end opposite the first end, and a threaded portion located between the first end and the second end. The plug also includes metallic foam coupled to the second end, a printed circuit board coupled to the metallic foam, the printed circuit board including a microchip configured to store information associated with the turbocharger, wherein at least part of the microchip is disposed within the fluid passage when the plug is coupled to the central housing, and a wire electronically coupling the microchip to an electronic control module, the wire passing through the body of the plug.

In another example, a turbocharger includes a turbocharger speed harness coupled to the turbocharger and configured to send turbocharger data to an engine control module via an engine wire harness that is connected to and communicatively coupled to the turbocharger speed harness, wherein a microchip is located in a chip adapter assembly that is configured to be inserted between the turbocharger speed harness and the engine wire harness.

DETAILED DESCRIPTION

Figure 1:
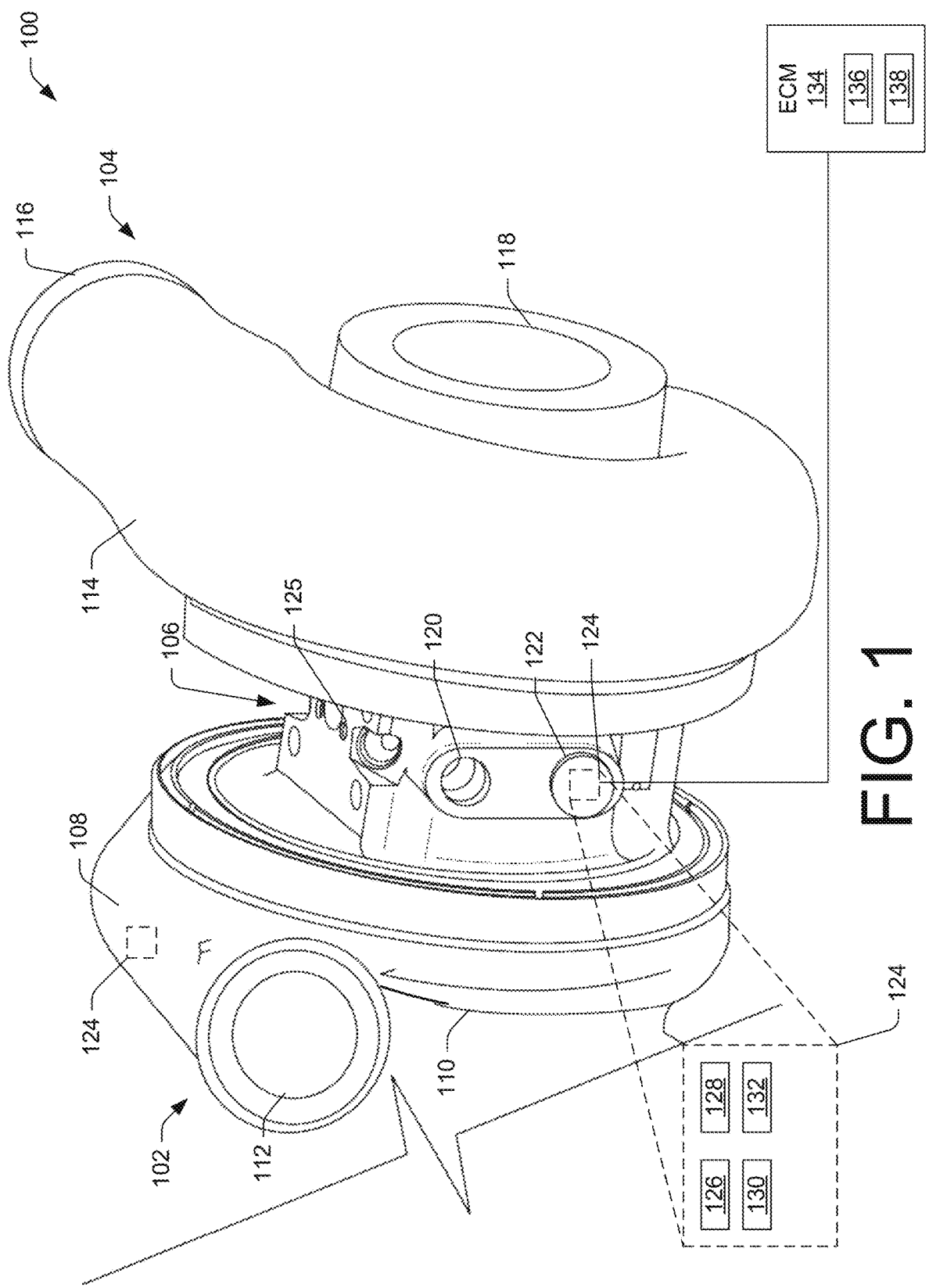
FIG. 1 illustrates an example turbocharger in accordance with an example of the present disclosure.

Wherever possible, the same reference numbers will be used throughout the drawings to refer to the same or like parts. FIG. 1 depicts an example turbocharger 100. The turbocharger 100 may be implemented in a variety of applications including gasoline and/or diesel vehicles, motorcycles, trucks, locomotives, aircraft, boats, heavy equipment among others. The turbocharger 100 is a turbine-driven device that forces compressed air into one or more combustion chambers of a combustion engine. In some examples, the turbocharger 100 may increase power output of an engine and engine efficiency by forcing compressed air into one or more combustion chambers of the combustion engine. Furthermore, some applications utilize multiple turbochargers such as the turbocharger 100 described in FIG. 1.

The turbocharger 100 includes a compressor section 102, a turbine section 104, and a central housing 106 located between the compressor section 102 and the turbine section 104. The compressor section 102 includes a compressor housing 108. The compressor housing 108 is configured to house a compressor wheel (or impeller) (not shown). The compressor wheel draws air into the turbocharger 100 through a compressor inlet 110 and forces the air through a compressor outlet 112 of the compressor housing 108. The air exiting the compressor outlet 112 is then provided to an intake manifold of the combustion engine where the air is provided to one or more combustion chambers of the combustion engine.

As mentioned previously, the turbocharger 100 also includes the turbine section 104. The turbine section 104 includes a turbine housing 114. The turbine housing 114 is configured to house a turbine wheel (not shown). The turbine wheel is rotated by exhaust gas received from the combustion engine via a turbine inlet 116. The exhaust gas rotates the turbine wheel and exits the turbine housing 114 via a turbine outlet 118. The turbine wheel is connected to the compressor wheel via a shaft such that when the exhaust gas rotates the turbine wheel, the turbine wheel rotates the compressor wheel via rotation of the shaft. By rotating the compressor wheel, air is drawn into the turbocharger, compressed by the compressor wheel, and provided to the intake manifold via the compressor outlet 112.

The turbocharger 100 also includes the central housing 106. The central housing 106 includes one or more bearings that allow the shaft that is coupled to the turbine wheel to rotate freely in order to translate rotation from the turbine wheel to the compressor wheel. As the turbocharger 100 receives exhaust gas from the combustion engine and compresses ambient air, the temperature of the turbocharger 100 tends to increase. For example, the turbine wheel may operate at temperatures that exceed 900° C. As such, the turbocharger 100 may be fluidly and/or otherwise thermally connected to a cooling system of an application (e.g., machine, vehicle, etc.) on which the turbocharger 100 is installed. The cooling system may be configured to draw heat from the turbocharger 100 by passing coolant liquid through the central housing 106 of the turbocharger 100. In some examples, the central housing 106 includes one or more coolant ports 120. The coolant ports 120 may receive coolant liquid (such as water, oil, or other type of coolant liquid) from an engine cooling system (or other source). In some examples, the coolant liquid may enter the coolant ports 120 and heat from the turbocharger 100 is transferred to the coolant liquid via conduction as the coolant liquid flows through the central housing 106. The coolant liquid then exits the central housing 106 through one or more coolant ports. As shown in FIG. 1, the port 120 that is visible may be an inlet port through which coolant enters the central housing 106. In some examples, the coolant may enter one or more coolant ports 120 on a first side (the side shown in FIG. 1) and may exit through one or more coolant ports on a second side of the central housing (not visible in FIG. 1) that is opposite the first side. Additionally, and/or alternatively, the central housing 106 may include an inlet port and an outlet port on a same side of the central housing 106.

The turbocharger 100 may also include a plug 122. In some examples, the plug 122 is a straight thread plug that accomplishes a seal in the central housing 106 via use of an O-ring. However, in some examples, the plug may include a tapered thread pattern or other type of plug. The plug 122 may be inserted into one of the coolant ports 120. In some examples, the plug 122 may be inserted on a side of the central housing 106 proximate inlet ports of the coolant ports 120. By placing the plug 122 in a port proximate inlet ports of the coolant ports 120, the plug 122 is inserted in a portion of the central housing 106 that may be cooler than a portion of the central housing 106 where coolant exits the central housing 106 after absorbing heat from the turbocharger 100. In some examples, however, the plug 122 may be inserted in a port proximate an outlet port of the central housing 106. The plug 122 includes a microchip 124 mounted on a printed circuit board (PCB) or other substrate. In some examples, the plug 122 is inserted into the central housing 106 such that the microchip 124 resides within the housing. Furthermore, the plug 122 may be inserted into the central housing 106 such that at least a portion of the microchip 124 is in contact with and/or is otherwise fluidly connected to coolant liquid flowing through the central housing 106.

In some examples, the plug 122 is inserted into the central housing 106 such that the microchip 124 is at least partially or entirely submerged in the coolant liquid (which may vary depending on the amount of coolant liquid present in the central housing 106). For example, the plug 122 may be inserted into a water jacket, coolant flow passage, or other coolant repository within the central housing 106. However, in some examples, the plug 122 may be inserted into the central housing 106 such that the microchip 124 does not contact coolant liquid. Furthermore, in some examples, the plug 122 may be inserted into an aperture in the compressor housing 108 or the plug 122 may be inserted into an oil inlet 125 in the central housing 106. Additionally, and/or alternatively, the microchip 124 may be adhered to an exterior surface of the compressor housing 108, as shown in FIG. 1. Furthermore, the plug 122 may include threading and may be inserted and secured in a port via the threading. Additionally, and/or alternatively, the plug 122 may be inserted into the central housing 106 and may be secured in the central housing 106 via other external fastening means (e.g., welded, bonded, fastened via a fastener, etc.).

In some examples, the microchip 124 may be packaged (sealed, coated, etc.) so as to withstand relatively high operating temperatures (e.g., up to and/or exceeding 150° C.). Additionally, and/or alternatively, the microchip 124 may be a high-temperature capable microchip being able to withstand high temperatures (e.g., up to and/or exceeding approximately 150° C.). The microchip 124 may include an erasable programmable read-only memory (EPROM) chip or other type of electronic chip. However, in some examples, the microchip 124 may be a writable chip. In some examples, the microchip 124 includes memory 126. The memory 126 may include nonvolatile and/or volatile memory. The memory 126 may also include removable and non-removable media implemented in ay type of technology for storage of information, such as computer-readable instructions, data structures, program components, or other data. Such computer-readable media may include, but is not limited to, RAM, ROM, EEPROM, flash memory or other memory technology, optical storage, solid state storage, or any other medium that may be used to store the desired information and that may be accessed by a computing device.

The memory 126 of the microchip 124 is configured to store information about the turbocharger 100 and/or components thereof. For example, the memory 126 of the microchip 124 may store information related to a part number of the turbocharger 100 and/or components thereof, a serial number of the turbocharger 100 and/or components thereof, or service history of the turbocharger 100 and/or components thereof, among other information. The memory 126 may also store application information describing the type of engine on which the turbocharger 100 has been installed including past applications on which the turbocharger 100 has been installed. The memory 126 may further be configured to store information regarding life cycle history (e.g., start time, run time, stop time, etc.) related to the turbocharger 100. The microchip 124 may also include keys and/or certificates 128 stored in the memory 126 such as an encryption certificate that indicates that the microchip 124 is authentic. In some examples, data sent from the microchip 124 may include the encryption certificate to encrypt and authenticate the data. Furthermore, data stored in the memory 126 of the microchip 124 may be encrypted. The microchip 124 may further include one or more processors 130 configured to execute one or more stored instructions. The microchip 124 may further include a general purpose input/output (GPIO) interface 132 allowing the processor 130 and/or other components of the microchip 124 to communicate with other devices. The microchip 124 may also track and monitor turbocharger 100 usage such as a number of hours that the turbocharger 100 has been used.

In some examples, the microchip 124 may be electronically coupled to an engine control module (ECM) 134 (or other device). For example, the microchip 124 and/or components thereof may be electronically coupled to the ECM 134 via a 1-Wire® connection, or other suitable wired or wireless connection. In some examples, the processor 130 of the microchip 124 is electronically coupled to the ECM 134.

The ECM 134 may be configured send a signal to the processor 130 on the microchip 124 and upon receiving a signal in return, the ECM 134 is able to determine whether the turbocharger 100 is an approved product for the specific application for which it is being used. For example, the ECM 134 may compare the encryption certificate of the microchip 124 with information stored in memory 136 of the ECM 134 to determine whether the turbocharger is an approved product for the application. Furthermore, the microchip 124 may be configured such that upon receiving a signal from the ECM 134, the microchip 124 may return a signal with data indicating the serial number and part number of the turbocharger 100 to the ECM 134. From such information, the ECM 134 may generate timestamp data including the serial number, part number, and time and date information. Such timestamp data may be stored in the memory 136 of the ECM 134. In some examples, the ECM 134 may be configured to transmit the timestamp data to one or more devices remote from the ECM 134 via network interface(s) 138. The network interface 138 may enable communication through one or more of the Internet, cable networks, cellular networks, wireless networks (e.g., Wi-Fi) and wired networks, as well as close-range communications such as Bluetooth®, and the like.

By tracking and recording timestamp data, the ECM 134 may record and track the number of hours that the turbocharger 100 has been used. Furthermore, through such a configuration the ECM 134 may also store data regarding various events in the life cycle of the turbocharger 100. For example, as mentioned previously, the microchip 124 may store information (e.g., part number, serial number, etc.) regarding the turbocharger 100 and the various components thereof. As such, when the ECM 134 receives information from the microchip 124, the ECM 134 may be configured to compare such information with previous timestamp data that is either stored in the memory 136 of the ECM 134 or a database accessible (via the network interface(s) 138) by the ECM 134. From such a comparison, the ECM 134 may determine whether a certain component of the turbocharger 100 has been replaced. Additionally, and/or alternatively, such information may also include an indication that one or more components of the turbocharger 100 have been serviced or rebuilt.

While describing the plug 122 and the microchip 124 in the context of a turbocharger 100, it is to be understood that the device and methods described herein may be implemented to track life cycle events of various other engine components.

Figure 2:
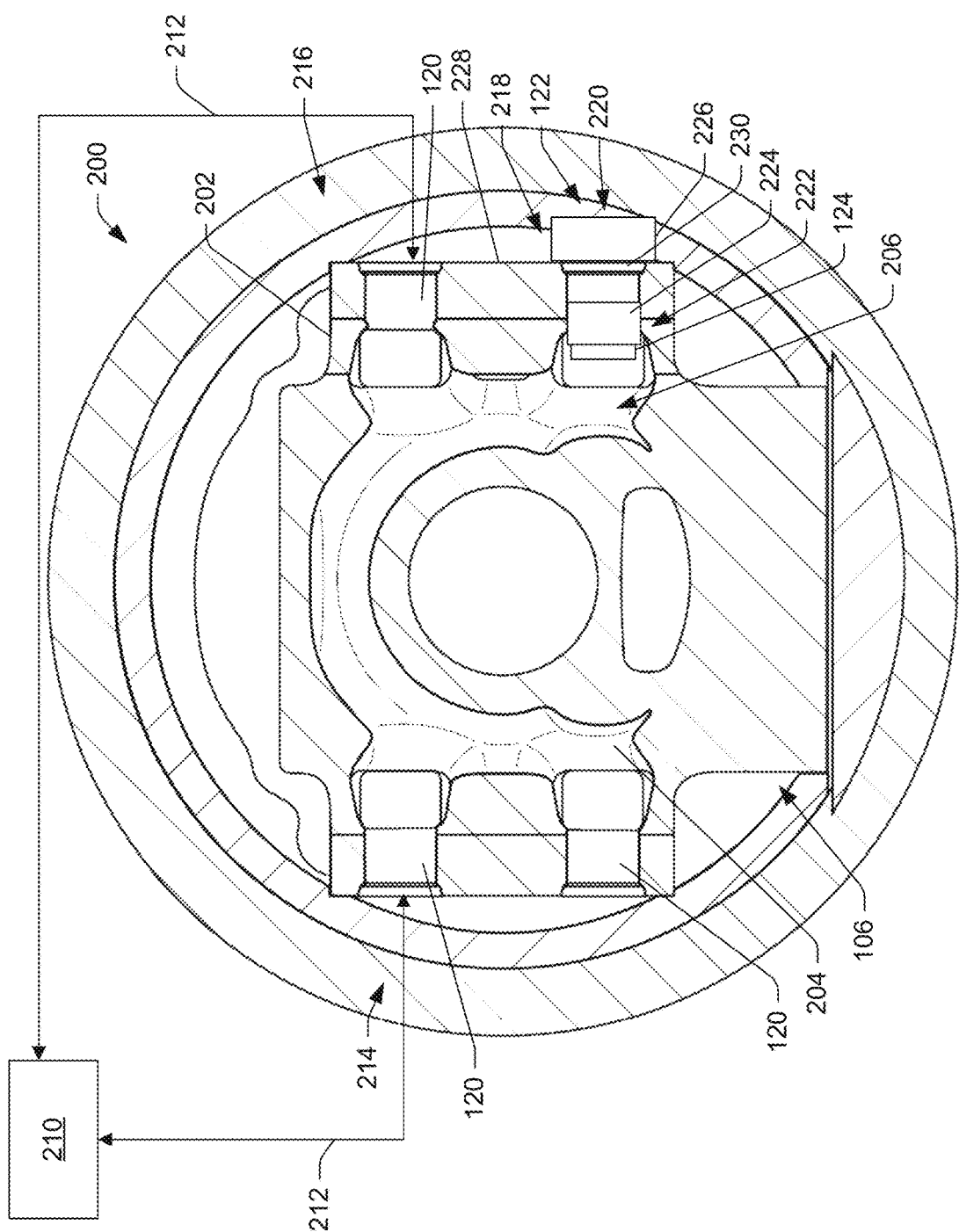
FIG. 2 illustrates a cross-sectional view of an example turbocharger in accordance with an example of the present disclosure.

FIG. 2 illustrates a cross-sectional view 200 of the central housing 106 of the turbocharger 100. As seen in FIG. 2, the plug 122 is inserted into the central housing 106 of the turbocharger 100. The central housing 106 of the turbocharger may include a block 202, forming the body of the central housing 106. The block 202 may include one or more fluid passages 204 cut and/or machined therein which form a water jacket 206 in the central housing 106 through which coolant liquid may flow. Furthermore, as previously mentioned, the plug 122 may be inserted, at least partially, into the water jacket 206 of the central housing 106. The water jacket 206 directs coolant liquid throughout the central housing 106 of the turbocharger 100 in order to cool the turbocharger 100.

As mentioned previously, the central housing 106 includes one or more coolant ports 120. 120 In some examples, a coolant reservoir 210 provides coolant liquid to the central housing via one or more flow lines 212. The coolant liquid flows into the central housing 106 through the coolant ports 120 and exits the central housing 106 through the coolant ports 120. The coolant liquid may then return to the coolant reservoir 210 via the flow lines 212 (or other component of an engine cooling system). In some examples, the central housing 106 may include an inlet port of the coolant ports 120 on a first side 214 of the central housing 106 and an outlet port of the coolant ports 120 on a second side 216 of the central housing 106, or vis versa. However, in some examples, the first side 214 of the central housing 106 may include an inlet port and an outlet port and the second side 216 of the central housing 106 may include an inlet port and an outlet port. As the coolant liquid flows into the coolant ports 120 and out of the coolant ports 120, the coolant liquid absorbs heat from the turbocharger 100 as it passes through the water jacket 206.

In some examples, the body 218 of the plug 122 is substantially cylindrical. However, the body 218 of the plug 122 may be shaped so as to correspond with a shape of the coolant ports 120 (or other port) in the central housing 106. Furthermore, the body 218 of the plug 122 may be solid or the body 218 of the plug 122 may be at least partially hollow. In some examples, the body 218 of the plug 122 may be formed from metal. In some examples, a material of the body 218 of the plug 122 may be selected from high thermal conductive metals. By selecting a material having high thermal conductivity, the plug 122 may transfer heat to the coolant liquid when the plug 122 is inserted into the central housing 106.

The body 218 of the plug 122 includes a first end 220 and a second end 222 opposite the first end 220. The body 218 of the plug 122 also includes a threaded portion 224 located between the first end 220 and the second end 222. For example, the threaded portion 224 may extend from the second end 222 of the body 218 to a location on the body 218 between the second end 222 and the first end 220. The threaded portion 224 includes external threading and the threaded portion 224 of the body 218 of the plug 122 may be configured to correspond with threading in a port (such as coolant ports 120 or other port) of the central housing 106. In some examples, the first end 220 of the body 218 includes a shoulder 226. The shoulder 226 of the body 218 has a diameter that is greater than a diameter of a port (such as coolant ports 120 or other port) in which the plug 122 is inserted. In some examples, the shoulder 226 abuts an outer surface 228 of the central housing 106 when the plug 122 is inserted into a port 120 (such as a coolant port or other type of port) in the central housing 106. Furthermore, the plug 122 may also include an O-ring 230 that is located on the body 218 of the plug 122 such that, when the plug 122 is inserted into a port (such as coolant ports 120 or other port), the O-ring 230 is located between the shoulder 226 of the plug and the outside surface 228 of the central housing 106, thereby forming a seal. As mentioned previously, the plug 122 includes a microchip 124 coupled thereto and configured to store information in the memory 126 thereof related to the turbocharger. When the plug 122 is inserted into a port (such as coolant ports 120 or other port) of the central housing 106, the microchip 124 may be at least partially submerged in coolant fluid in the water jacket 206.

Figure 3:
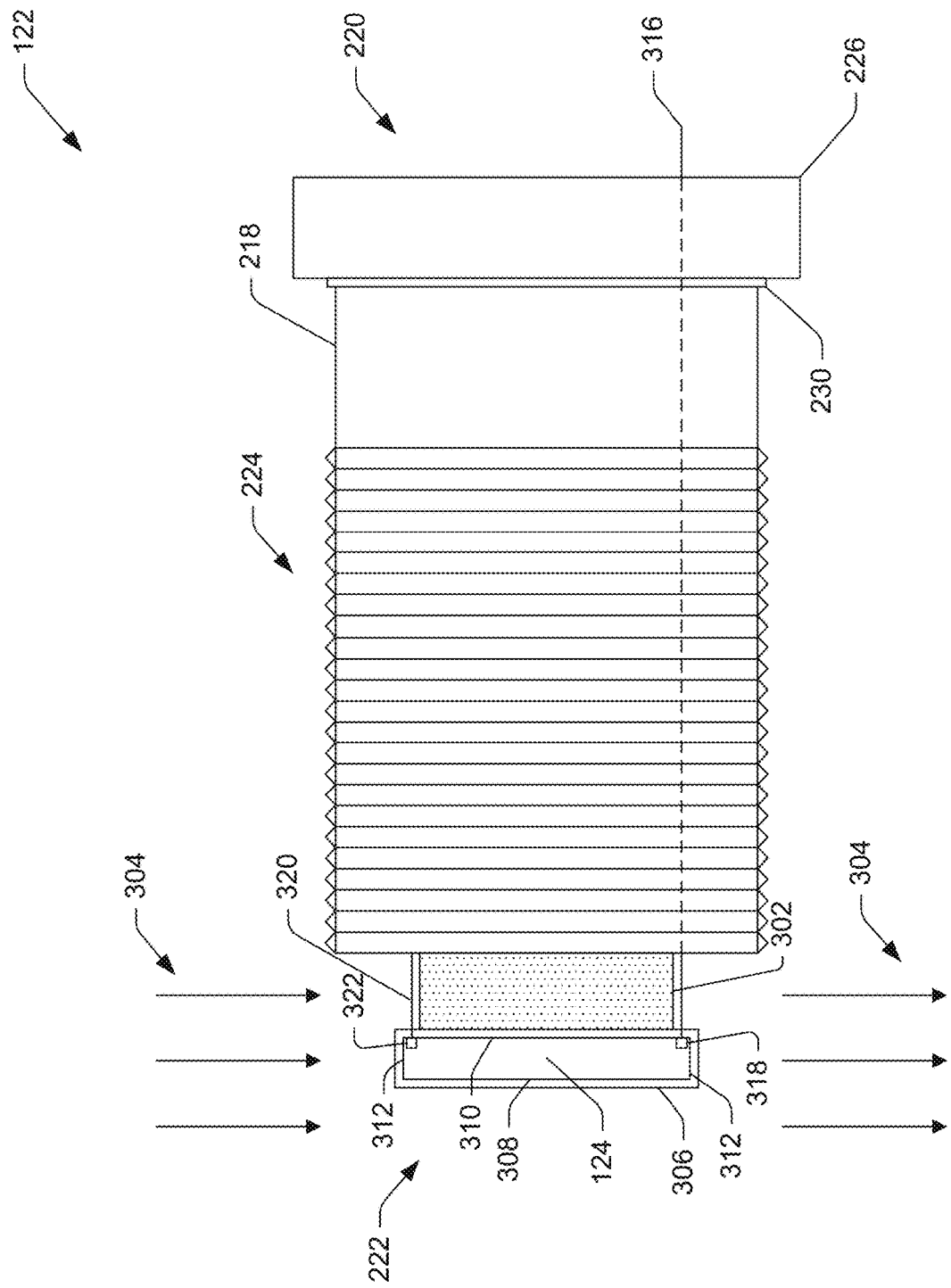
FIG. 3 is a schematic diagram of an example plug having a microchip in accordance with an example of the present disclosure.

FIG. 3 illustrates an example plug 122 having a microchip 124 coupled thereto. In some examples, the plug 122 includes a heat sink 302 that is coupled to the second end 222 of the plug 122. The heat sink 302 may be coupled to the plug 122 via an adhesive. The adhesive may include an acrylic adhesive, epoxy (one-part or two-part epoxy), polyurethane reactive adhesives, urethane adhesives, anaerobic adhesives, instant adhesives (e.g., cyanoacrylates), etc. In some examples, the adhesive is selected to be able to withstand temperatures up to and/or exceeding 150° C. However, the heat sink 302 may be coupled to the plug 122 via other means such as a mechanical fastener (e.g., bolt, screw, staple, etc.). In some examples, the heat sink 302 may be metallic foam having pores configured to permit passage of the coolant liquid at least partially therethrough. By placing the heat sink 302 between the body 218 of the plug 122 and the microchip 124, the microchip 124 may be surrounded by coolant liquid, thereby improving the cooling effects of the coolant liquid on the microchip 124. For example, the heat sink 302 spaces the microchip 124 from the plug 122 and, as a result, the coolant liquid may be present on each side of the microchip 124. The coolant liquid draws heat away from the plug 122 and the microchip 124 via conductive and/or convective heat transfer. In some examples, the coolant liquid may flow across the microchip 124 and/or through the heat sink 302, as shown by arrows 304.

Furthermore, the microchip 124 may be packaged such that the microchip 124 is at least partially encapsulated or entirely sealed by a sealant 306 or other material. In some examples, the sealant 306 is formed from a material having a relatively low thermal conductivity (and/or relatively high thermal resistance) so as to reduce the amount of heat that the microchip 124 absorbs from surrounding components. In some examples, the sealant 306 may be applied to multiple sides of the microchip 124. For example, the sealant 306 may be applied to a top surface 308, a bottom surface 310, and side surfaces 312 of the microchip 124. However, in some examples, the sealant 306 may not be applied to the bottom surface 310 where the microchip 124 contacts the heat sink 302. Still further, the sealant 306 may be applied to the microchip 124 such that the sealant 306 is only applied to one or more components (e.g., processor, memory, etc.) of the microchip 124.

In some examples, the microchip 124 is coupled to the heat sink 302 via an adhesive. For example, the adhesive may be applied to the bottom surface 310 of the microchip 124 and the microchip 124 may be adhered to the heat sink 302 such that the bottom surface 310 of the microchip 124 contacts the heat sink 302. The adhesive may be the same adhesive used to couple the heat sink 302 to the plug 122 or the adhesive may be a different adhesive. For example, the adhesive used to couple the microchip 124 to the heat sink 302 may include an acrylic adhesive, epoxy (one-part or two-part epoxy), polyurethane reactive adhesives, urethane adhesives, anaerobic adhesives, instant adhesives (e.g., cyanoacrylates), etc. In some examples, the adhesive is selected to be able to withstand temperatures up to and/or exceeding 150° C.

In some examples, a first wire 316 is electrically connected to a first terminal 318. The first terminal 318 may be mounted to a PCB (or other substrate) or the first terminal 318 may be formed by the PCB (or other substrate). The first terminal 318 includes leads connecting the first terminal 318 to the microchip 124 and/or other components mounted on the PCB or other substrate (e.g., the processor 130, the memory 126, etc.). In some examples, the first wire 316 is connected to the first terminal 318 prior to the sealant 306 and/or the adhesive being applied to the microchip 124 such that the sealant 306 and/or adhesive forms around the first wire 316. The first wire 316 passes through the body 218 of the plug 122. In some examples, the body 218 of the plug 122 includes a hole that is drilled or otherwise formed therein, allowing the first wire 316 to pass therethrough. The first wire 316 electronically couples the microchip 124 to the ECM 134 or other device. As mentioned previously, the ECM 134 (or other device) sends a voltage signal to the microchip 124 via the first wire 316 when an event occurs (e.g., engine startup, engine shutdown, etc.). In return, the microchip 124 transmits information to the ECM 134 via the first wire 316. The ECM 134 may record such information and generate timestamp data from the information transmitted from the microchip 124. The plug 122 also includes a second wire 320 that grounds the microchip 124 to the body 218 of the plug 122. In some examples, the second wire 320 is connected to a second terminal 322. The second terminal 322 includes leads connecting the second terminal 322 to the microchip 124 and/or other components on the PCB (e.g., the processor 130, the memory 126, etc.).

Figure 4:
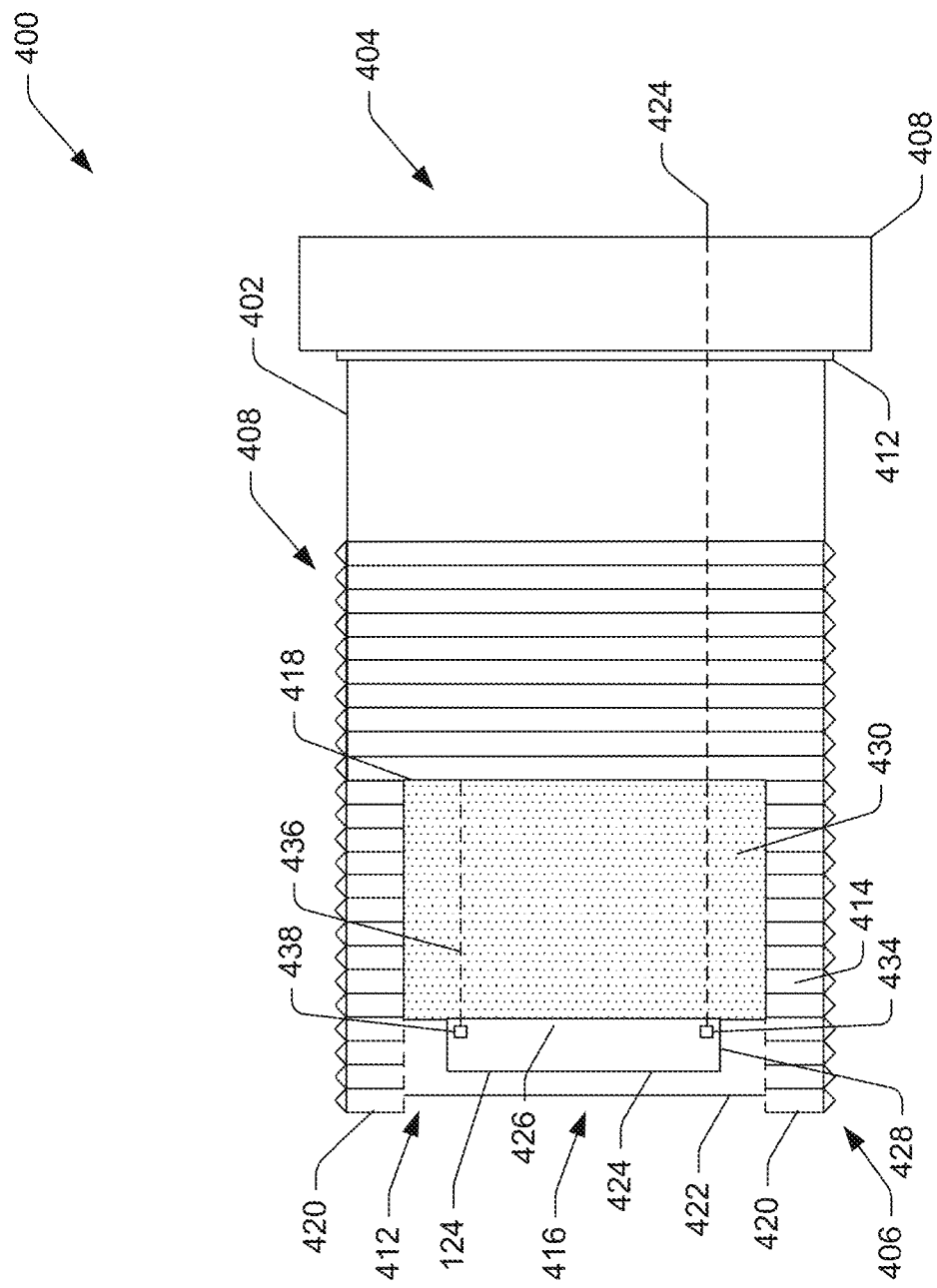
FIG. 4 is schematic diagram of an example plug having a microchip in accordance with an example of the present disclosure.

FIG. 4 illustrates another example plug 400 having a microchip 124 coupled thereto. The plug 400 may be substantially similar to the plug 122 shown in FIG. 3 but may include additional and/or different features. For example, the plug 400 includes a body 402 having a first end 404 and a second end 406 opposite the first end 404. The body 402 of the plug 400 also includes a threaded portion 408 located between the first end 404 and the second end 406. For example, the threaded portion 408 may extend from the second end 406 to a location on the body 402 between the second end 406 and the first end 404. In some examples, the threaded portion 408 may include straight threads or tapered threads. The threaded portion 408 of the body 402 of the plug 400 may be configured to correspond with threading in a port (such as coolant ports 120 or other port) of the central housing 106. In some examples, the first end 404 of the plug 400 includes a shoulder 409 that includes a diameter that is greater than a diameter of a port (such as coolant ports 120 or other port) in which the plug 400 is inserted such that the shoulder 409 abuts an outside surface 228 of the central housing 106 when the plug 400 is inserted into a port (such as coolant ports 120 or other port) in the central housing 106. Furthermore, the plug 400 may also include an O-ring 410 that is located on the body 402 of the plug 400 such that, when the plug 400 is inserted into a port (such as coolant ports 120 or other port), the O-ring 410 is located between the shoulder 409 of the plug 400 and the outside surface 228 of the central housing 106, thereby forming a seal.

As shown in FIG. 4, the plug 400 may include a cavity 412. The cavity 412 is formed by a hollow interior space in the body 402 of the plug 400. In some examples, the cavity 412 is formed by removing a cylindrical portion of the body 402 of the plug 400 at the second end 406 of the plug 400. The cavity 412 includes a substantially cylindrical sidewall 414 surrounding the cavity 412 along a longitudinal axis of the plug 400. The cavity 412 includes a single opening 416 located at the second end 406 of the plug 400. The cavity 412 includes a base 418 opposite the opening 416 of the cavity 412. In some examples, the microchip 124 is disposed within the cavity 412 such that the microchip 124 does not extend past a boundary 420 of the cavity 412. The boundary of the cavity 412 may be defined by an end of the sidewall 414 proximate the second end 406 of the plug 400. However, in some examples, the microchip 124 may be disposed within the cavity 412 such that a portion of the microchip 124 is disposed within the opening 416 and a portion of the microchip 124 extends past the boundary 420 of the cavity 412.

In some examples, the microchip 124 may be packaged such that the microchip 124 is at least partially encapsulated or sealed by a sealant 422 or other material. In some examples, the sealant 422 is formed from a material having a low thermal conductivity (and/or high thermal resistance) so as to reduce the amount of heat that the microchip 124 absorbs from surrounding components. The sealant 422 may be applied to multiple sides of the microchip 124. In some examples, the sealant 422 may entirely surround the microchip 124 and the sealant 422 may contact the sidewall 414 of the cavity 412. However, in some examples, the sealant 422 may be applied to each side of the microchip 124 except where the microchip 124 contacts a heat sink (described further herein below) and/or body 402 of the plug 400. For example, the sealant 422 may be applied to a top surface 424, a bottom surface 426, and side surfaces 428 of the microchip 124. However, in some examples, the sealant 422 may not be applied to the bottom surface 426 where the microchip 124 contacts the heat sink. Still further, the sealant 422 may be applied to the microchip 124 such that the sealant 422 is only applied to one or more components (e.g., processor, memory, etc.) of the microchip 124.

As mentioned previously, the plug 400 includes a heat sink 430 that is coupled to the base 418 of the cavity 412. However, in some examples, the heat sink 430 may be coupled to the sidewall 414 such that the heat sink 430 does not contact the base 418 of the cavity (i.e., there is a space between the heat sink 430 and the base 418). As described above with respect to FIG. 3, the heat sink 430 may be coupled to the plug 400 via an adhesive. The adhesive may include an acrylic adhesive, epoxy (one-part or two-part epoxy), polyurethane reactive adhesives, urethane adhesives, anaerobic adhesives, instant adhesives (e.g., cyanoacrylates), etc. In some examples, the adhesive is selected to be able to withstand temperatures up to and/or exceeding 150° C. However, the heat sink 430 may be coupled to the plug 400 via other means including mechanical fasteners. In some examples, the heat sink 430 may be metallic foam. Additionally, and/or alternatively, the heat sink 430 may be omitted and/or may comprise the body 402 of the plug 400 with the body 402 acting as the heat sink 430. For example, a material selected from the body 402 of the plug 400 may include thermal properties such that the body 402 of the plug 400 draws heat away from the microchip 124. Furthermore, in some examples, the heat sink 430 may be omitted and may be replaced with an insert made from ceramic, polymer, or other material having a low thermal conductivity (and/or high thermal resistance).

In some examples, the microchip 124 is coupled to the heat sink 430 via an adhesive. The adhesive may be the same adhesive used to couple the heat sink 430 to the plug 400 or the adhesive may be a different adhesive. For example, the adhesive used to couple the microchip 124 to the heat sink 430 may include an acrylic adhesive, epoxy (one-part or two-part epoxy), polyurethane reactive adhesives, urethane adhesives, anaerobic adhesives, instant adhesives (e.g., cyanoacrylates), etc. In some examples, the adhesive is selected to be able to withstand temperatures up to and/or exceeding 150° C.

The plug 400 may further include a first wire 432 that is electrically connected to a first terminal 434. The first terminal 434 may be mounted to a PCB (or other substrate) or the first terminal 434 may be formed by the PCB (or other substrate). The first terminal 434 on the microchip 124 includes leads connecting the first terminal 434 to the microchip 124 and/or other components on the substrate (e.g., the processor 130, the memory 126, etc.). In some examples, the first wire 432 is connected to the first terminal 434 prior to the sealant 422 and/or the adhesive being applied to the microchip 124 such that the sealant 422 and/or adhesive forms around the first wire 432. The first wire 432 passes through the heat sink 430 the body 402 of the plug 400 and electronically couples the microchip 124 to the ECM 134 or other device. In some examples, the heat sink 430 and the plug 400 include holes that are drilled or otherwise formed therein, allowing the first wire 432 to pass therethrough. As mentioned previously, the ECM 134 (or other device) sends a voltage signal to the microchip 124 via the first wire 432 when an event occurs (e.g., engine startup, engine shutdown, etc.). In response, the microchip 124 transmits information to the ECM 134 via the first wire 432. The ECM 134 may record such information and generate timestamp data from the information transmitted from the microchip 124.

The plug 400 also includes a second wire 436 that grounds the microchip 124 to the body 402 of the plug 400. In some examples, the second wire 436 is connected to a second terminal 438. The second terminal 438 includes leads connecting the second terminal 438 to the microchip 124 and/or other components mounted on the substrate (e.g., the processor 130, the memory 126, etc.). FIGS. 3 and 4 depict and describe the microchip 124 as being located on the plug 122 and 400 in a position such that when the plug 122 and 400 is inserted into the central housing 106, the microchip 124 is located within the central housing 106. However, in some examples, the microchip 124 may be coupled to an exterior portion of the plug 122 and 400 (i.e., coupled to the first end 220 and 404) such that when the plug 122 and 400 is inserted into the central housing 106, the plug remains outside of the central housing 106.

Figure 5:
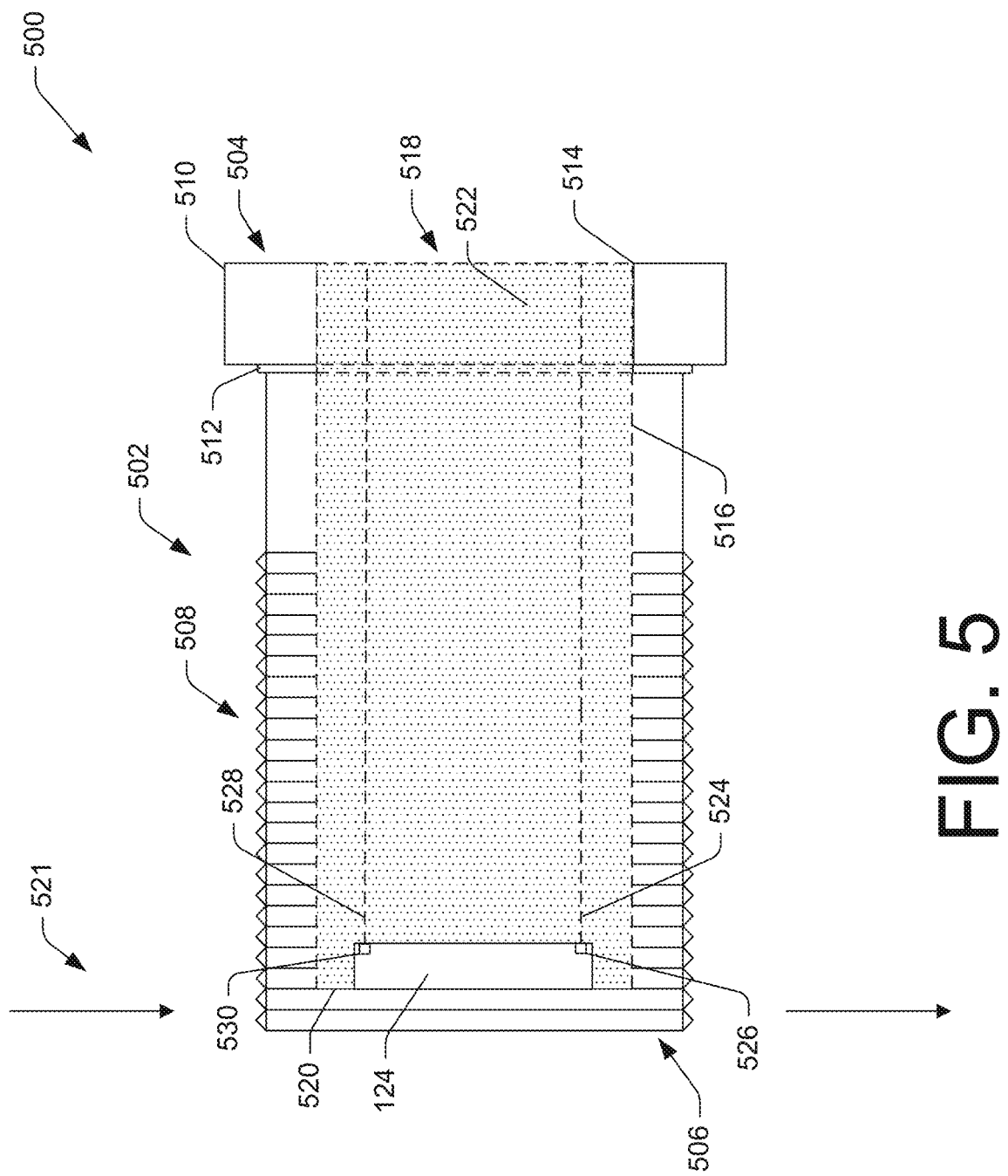
FIG. 5 is a schematic diagram of an example plug having a microchip in accordance with an example of the present disclosure.

FIG. 5 illustrates still another example plug 500 having a microchip 124 coupled thereto. The plug 500 may be similar to the plug 122 shown in FIG. 3 but may include additional and/or different features. For example. the plug 500 includes a body 502 having a first end 504 and a second end 506 opposite the first end 504. The body 502 of the plug 500 includes a threaded portion 508 located between the first end 504 and the second end 506. For example, the threaded portion 508 may extend from the second end 506 to a location on the body 502 between the second end 506 and the first end 504. In some examples, the threaded portion 508 may include straight threads or tapered threads. The threaded portion 508 of the body of the plug 500 may be configured to correspond with threading in a port (inlet port 120 or outlet port 120) of the central housing 106. In some examples, the first end 504 of the plug 500 includes a shoulder 510 that includes a diameter that is greater than a diameter of a port in which the plug 500 is inserted such that the shoulder 510 abuts an outside surface 228 of the central housing 106 when the plug 500 is inserted into a port in the central housing 106. Furthermore, the plug 500 may also include an O-ring 512 that is located on the body 502 of the plug 500 such that, when the plug 500 is inserted into a port, the O-ring 512 is located between the shoulder 510 of the plug 500 and the outside surface 228 of the central housing 106, thereby forming a seal.

As shown in FIG. 5, the plug 500 may include a cavity 514. The cavity 514 is formed by a hollow interior space in the body 502 of the plug 500. In some examples, the cavity 514 is formed by removing cylindrical portion of the body 502 of the plug 500 at the first end 504 of the plug 500. The cavity 514 includes a substantially cylindrical sidewall 516 surrounding the cavity 514 along a longitudinal axis of the plug 500. The cavity 514 includes a single opening 518 located at the first end 504 of the plug 500. The cavity includes a base 520 opposite the opening 518 of the cavity 514. In some examples, the microchip 124 is disposed within the cavity 514 such that the microchip 124 is not exposed to fluid in the central housing 106. For example, as shown in FIG. 5, the cavity 514 may extend from the first end 504 of the plug 500 and may include a length that is less than a length of the body 502 of the plug 500 such that a portion of the body 502 of the plug 500 is located between the cavity 514 and the second end 506 of the plug 500. In such a configuration, the body 502 of the plug 500 may contact fluid in the central housing 106 such that the plug 500 transfers heat to the coolant fluid. For example, the coolant fluid may flow in a direction shown by arrow 521 and may contact at least the second end 506 of the plug 500. Since the microchip 124 is located within the cavity 514 as shown in FIG. 5, the microchip 124 may not be encapsulated by a thermal sealant as described above with respect to FIGS. 3 and 4. However, in some examples, the microchip 124 shown and described in FIG. 5 may be partially or entirely encapsulated by a sealant or may be insulated (using a sealant or insulating material).

The plug 500 further includes a heat sink 522 that is inserted into the cavity 514. In some examples, the heat sink 522 may be fixedly attached inside the cavity 514 by coupling the heat sink 522 to the sidewall 516 of the cavity 514 or other portion of the cavity 514. For example, the heat sink 522 may be adhered to the sidewall 516 of the cavity 514 via an adhesive. The adhesive may include an acrylic adhesive, epoxy (one-part or two-part epoxy), polyurethane reactive adhesives, urethane adhesives, anaerobic adhesives, instant adhesives (e.g., cyanoacrylates), etc. In some examples, the adhesive is selected to be able to withstand temperatures up to and/or exceeding 150° C. In some examples, the heat sink 522 may be attached to the base 520 of the cavity 514 in addition to or instead of the sidewall 516. Furthermore, the heat sink 522 may be coupled to the plug 500 via other means including mechanical fasteners in addition to or instead of an adhesive. In some examples, the heat sink 522 may include a metallic foam. Additionally, and/or alternatively, the heat sink 522 may include other materials. Such a material may include thermal properties such that the heat sink 522 draws heat away from the microchip 124. Furthermore, in some examples, the heat sink 522 may be omitted and may be replaced with an insert made from ceramic polymer, or other material having low thermal conductivity (and/or high thermal resistance). For example, the heat sink 522 may include an insulating material that insulates the microchip 124. In such an example, each side of the microchip 124 may be insulated. However, in some examples, less than each side of the microchip 124 may be insulated with an insulating material.

In some examples, the microchip 124 is coupled to the heat sink 522 via an adhesive. The adhesive may be the same adhesive used to couple the heat sink 522 to the plug 500 or the adhesive may be a different adhesive. For example, the adhesive used to couple the microchip 124 to the heat sink 522 may include an acrylic adhesive, epoxy (one-part or two-part epoxy), polyurethane reactive adhesives, urethane adhesives, anaerobic adhesives, instant adhesives (e.g., cyanoacrylates), etc. In some examples, the adhesive is selected to be able to withstand temperatures up to and/or exceeding 150° C.

The plug 500 may further include a first wire 524 that is electrically connected to a first terminal 526. The first terminal 526 may be mounted to a PCB (or other substrate) or the first terminal 526 may be formed by the PCB (or other substrate). The first terminal 526 on the microchip 124 includes leads connecting the first terminal 526 to the microchip 124 and/or other components on the substrate (e.g., the processor 130, the memory 126, etc.). In some examples, the first wire 524 is connected to the first terminal 526 prior to an adhesive being applied to the microchip 124 such that the adhesive forms around the first wire 524. The first wire 524 passes through the heat sink 522 the body 502 of the plug 500 and electronically couples the microchip 124 to the ECM 134 or other device. In some examples, the heat sink 522 and the plug 500 include holes that are drilled or otherwise formed therein, allowing the first wire 524 to pass therethrough. As mentioned previously, the ECM 134 (or other device) sends a voltage signal to the microchip 124 via the first wire 524 when an event occurs (e.g., engine startup, engine shutdown, etc.). In response, the microchip 124 transmits information to the ECM 134 via the first wire 524. The ECM 134 may record such information and generate timestamp data from the information transmitted from the microchip 124. The plug 500 also includes a second wire 528 that grounds the microchip 124 to the body 502 of the plug 500 or other portion of the turbocharger 100. In some examples, the second wire 528 is connected to a second terminal 530. The second terminal 530 includes leads connecting the second terminal 530 to the microchip 124 and/or other components mounted on the substrate (e.g., the processor 130, the memory 126, etc.).

Figure 6:
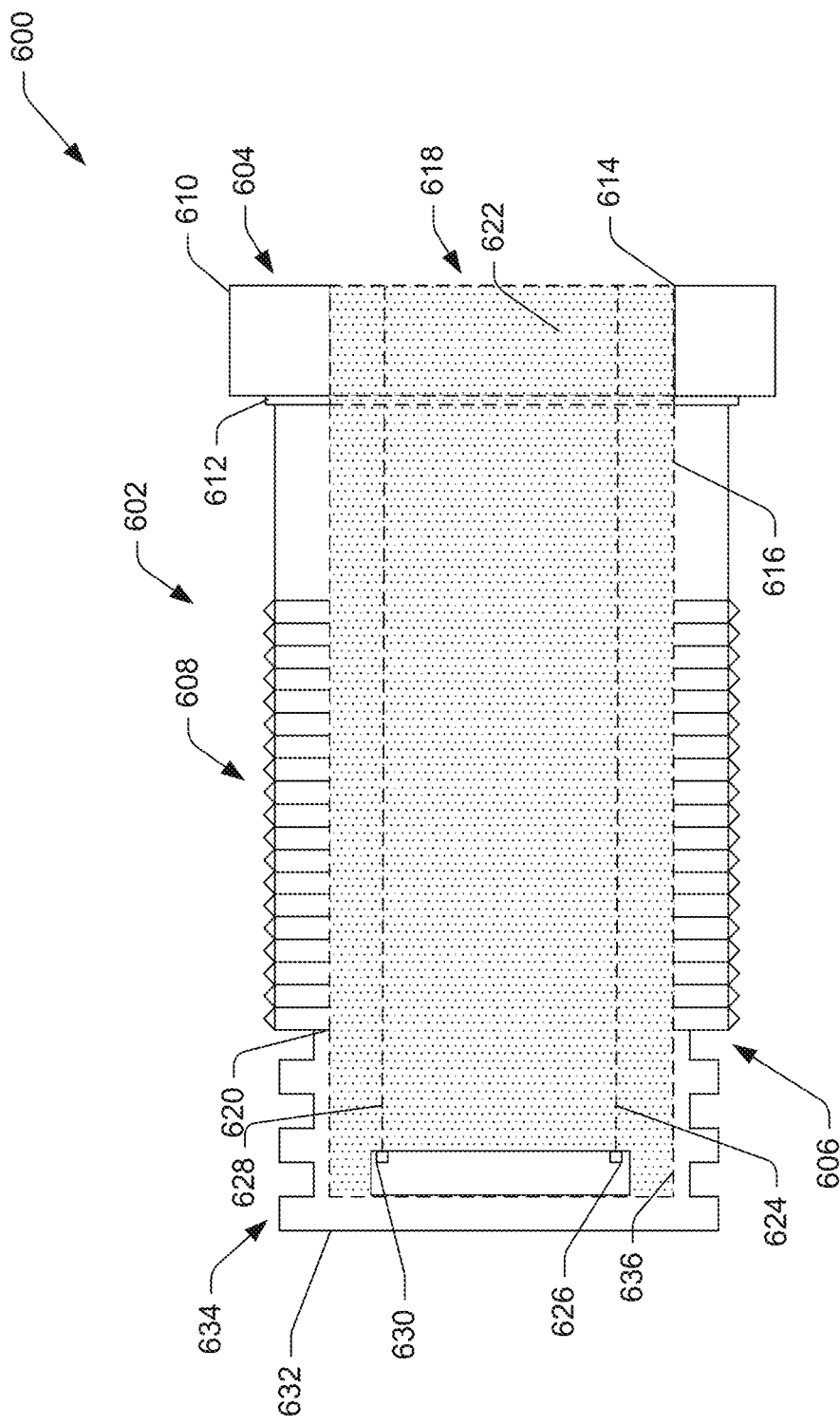
FIG. 6 is a schematic diagram of an example plug having a microchip in accordance with an example of the present disclosure.

FIG. 6 illustrates another example plug 600 having a microchip 124 coupled thereto. The plug 600 may be similar to the plug 122 shown in FIG. 5 but may include additional and/or different features. For example. the plug 600 includes a body 602 having a first end 604 and a second end 606 opposite the first end 604. The body 602 of the plug 600 includes a threaded portion 608 located between the first end 604 and the second end 606. For example, the threaded portion 608 may extend from the second end 606 to a location on the body 602 between the second end 606 and the first end 604. In some examples, the threaded portion 608 may include straight threads or tapered threads. The threaded portion 608 of the body of the plug 600 may be configured to correspond with threading in a port (inlet port 120 or outlet port 120) of the central housing 106. In some examples, the first end 604 of the plug 600 includes a shoulder 610 that includes a diameter that is greater than a diameter of a port in which the plug 600 is inserted such that the shoulder 610 abuts an outside surface 228 of the central housing 106 when the plug 600 is inserted into a port in the central housing 106. Furthermore, the plug 600 may also include an O-ring 612 that is located on the body 602 of the plug 600 such that, when the plug 600 is inserted into a port, the O-ring 612 is located between the shoulder 610 of the plug 600 and the outside surface 228 of the central housing 106, thereby forming a seal.

As shown in FIG. 6, the plug 600 may include a cavity 614. The cavity 614 is formed by a hollow interior space in the body 602 of the plug 600. In some examples, the cavity 614 is formed by removing cylindrical portion of the body 602 of the plug 600 at the first end 604 or the second end 606 of the plug 600. The cavity 614 includes a substantially cylindrical sidewall 616 surrounding the cavity 614 along a longitudinal axis of the plug 600. The cavity 614 includes a first opening 618 located at the first end 604 of the plug 500. The cavity also includes a second opening 620 opposite the first opening 618 of the cavity 614. In some examples, the cavity 614 extends from the first end 604 of the plug 600 and may include a length that is equal to a length of the body 602 of the plug 600 such the cavity 614 extends an entire length of the body 602 of the plug 600.

The plug 600 further includes a heat sink 622 that is inserted into the cavity 614. In some examples, the heat sink 622 may be fixedly attached inside the cavity 614 by coupling the heat sink 622 to the sidewall 616 of the cavity 514 or other portion of the cavity 614. For example, the heat sink 622 may be adhered to the sidewall 616 of the cavity 614 via an adhesive. The adhesive may include an acrylic adhesive, epoxy (one-part or two-part epoxy), polyurethane reactive adhesives, urethane adhesives, anaerobic adhesives, instant adhesives (e.g., cyanoacrylates), etc. In some examples, the adhesive is selected to be able to withstand temperatures up to and/or exceeding 150° C. Furthermore, the heat sink 622 may be coupled to the plug 600 via other means including mechanical fasteners in addition to or instead of an adhesive. In some examples, the heat sink 622 may include a metallic foam. Additionally, and/or alternatively, the heat sink 622 may include other materials. Such a material may include thermal properties such that the heat sink 622 draws heat away from the microchip 124. Furthermore, in some examples, the heat sink 622 may be omitted and may be replaced with an insert made from ceramic polymer, or other material having low thermal conductivity (and/or high thermal resistance). For example, the heat sink 522 may include an insulating material that insulates the microchip 124. In such an example, each side of the microchip 124 may be insulated. However, in some examples, less than each side of the microchip 124 may be insulated with an insulating material.

In some examples, the microchip 124 is coupled to the heat sink 622 via an adhesive. The adhesive may be the same adhesive used to couple the heat sink 622 to the plug 600 or the adhesive may be a different adhesive. For example, the adhesive used to couple the microchip 124 to the heat sink 622 may include an acrylic adhesive, epoxy (one-part or two-part epoxy), polyurethane reactive adhesives, urethane adhesives, anaerobic adhesives, instant adhesives (e.g., cyanoacrylates), etc. In some examples, the adhesive is selected to be able to withstand temperatures up to and/or exceeding 150° C.

The plug 600 may further include a first wire 624 that is electrically connected to a first terminal 626. The first terminal 626 may be mounted to a PCB (or other substrate) or the first terminal 626 may be formed by the PCB (or other substrate). The first terminal 626 on the microchip 124 includes leads connecting the first terminal 626 to the microchip 124 and/or other components on the substrate (e.g., the processor 130, the memory 126, etc.). In some examples, the first wire 624 is connected to the first terminal 626 prior to an adhesive being applied to the microchip 124 such that the adhesive forms around the first wire 624. The first wire 624 passes through the heat sink 622 the body 602 of the plug 600 and electronically couples the microchip 124 to the ECM 134 or other device. In some examples, the heat sink 622 and the plug 500 include holes that are drilled or otherwise formed therein, allowing the first wire 624 to pass therethrough. As mentioned previously, the ECM 134 (or other device) sends a voltage signal to the microchip 124 via the first wire 624 when an event occurs (e.g., engine startup, engine shutdown, etc.). In response, the microchip 124 transmits information to the ECM 134 via the first wire 624. The ECM 134 may record such information and generate timestamp data from the information transmitted from the microchip 124. The plug 600 also includes a second wire 628 that grounds the microchip 124 to the body 602 of the plug 600 or other portion of the turbocharger 100. In some examples, the second wire 628 is connected to a second terminal 630. The second terminal 630 includes leads connecting the second terminal 630 to the microchip 124 and/or other components mounted on the substrate (e.g., the processor 130, the memory 126, etc.).

As shown in FIG. 6, the plug 600 may further include a cylinder 632 that is attached to the second end 606 of the body 602 of the plug 600. In some examples, the cylinder 632 may be brazed to the second end 606 of the plug 600. The cylinder 632 may be an aluminum cylinder and may be configured to be at least partially immersed in coolant liquid flow in the central housing 106. By immersing the cylinder 632 in coolant liquid, the cylinder 632 may transfer heat from the plug 600 to the coolant liquid. The cylinder 632 may include one or more fins 634 that provide additional surface area of the cylinder 632 to increase an amount of exterior surface area of the cylinder 632 that may contact coolant fluid in the central housing 106. In some examples, the heat sink 622 may be inserted into the cylinder 632, as shown in FIG. 6. Furthermore, the microchip 124 may be coupled to the heat sink 622 such that the microchip 124 is located within the cylinder 632. Additionally, and/or alternatively, the microchip 124 may be coupled to an interior surface 636 of the cylinder 632 and/or the microchip 124 may be located within the cylinder 632 while not contacting one or more of the interior surfaces of the cylinder 632. In some examples, the microchip 124 resides within the cylinder 632 and is not directly exposed to coolant fluid.

Figure 7:
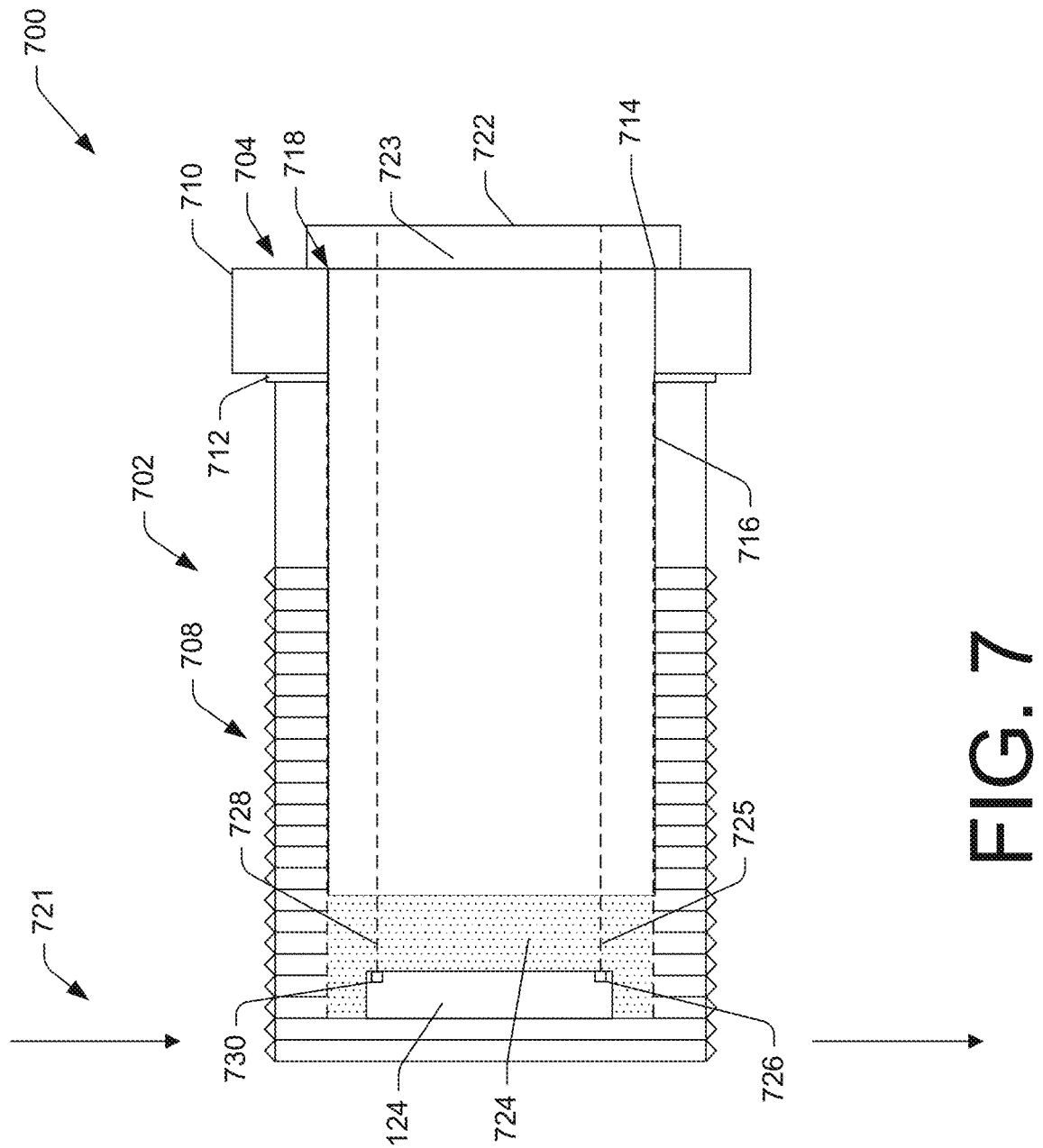
FIG. 7 is a schematic diagram of an example plug having a microchip in accordance with an example of the present disclosure.

FIG. 7 illustrates still another example plug 700 having a microchip 124 coupled thereto. The plug 700 may be similar to the plug 122 shown in FIG. 5 but may include additional and/or different features. For example. the plug 700 includes a body 702 having a first end 704 and a second end 706 opposite the first end 704. The body 702 of the plug 700 includes a threaded portion 708 located between the first end 704 and the second end 706. For example, the threaded portion 708 may extend from the second end 706 to a location on the body 702 between the second end 706 and the first end 704. In some examples, the threaded portion 708 may include straight threads or tapered threads. The threaded portion 708 of the body of the plug 700 may be configured to correspond with threading in a port (inlet port 120 or outlet port 120) of the central housing 106. In some examples, the first end 704 of the plug 700 includes a shoulder 710 that includes a diameter that is greater than a diameter of a port in which the plug 700 is inserted such that the shoulder 710 abuts an outside surface 228 of the central housing 106 when the plug 700 is inserted into a port in the central housing 106. Furthermore, the plug 700 may also include an O-ring 712 that is located on the body 702 of the plug 700 such that, when the plug 700 is inserted into a port, the O-ring 712 is located between the shoulder 710 of the plug 700 and the outside surface 228 of the central housing 106, thereby forming a seal.

As shown in FIG. 7, the plug 700 may include a cavity 714. The cavity 714 is formed by a hollow interior space in the body 702 of the plug 700. In some examples, the cavity 714 is formed by removing cylindrical portion of the body 702 of the plug 700 at the first end 704 of the plug 700. The cavity 714 includes a substantially cylindrical sidewall 716 surrounding the cavity 714 along a longitudinal axis of the plug 700. In some examples, the sidewall 716 may include threading configured to correspond with threading of an insert (described further herein). The cavity 714 includes a single opening 718 located at the first end 704 of the plug 700. The cavity includes a base 720 opposite the opening 718 of the cavity 714. In some examples, the microchip 124 is disposed within the cavity 714 such that the microchip 124 is not exposed to fluid in the central housing 106. For example, as shown in FIG. 7, the cavity 714 may extend from the first end 704 of the plug 700 and may include a length that is less than a length of the body 702 of the plug 700 such that a portion of the body 702 of the plug 700 is located between the cavity 714 and the second end 706 of the plug 700. In such a configuration, the body 702 of the plug 700 may contact fluid in the central housing 106 such that the plug 700 transfers heat to the coolant fluid. For example, the coolant fluid may flow in a direction shown by arrow 721 and may contact at least the second end 706 of the plug 700. Since the microchip 124 is located within the cavity 714 as shown in FIG. 7, the microchip 124 may not be encapsulated by a thermal sealant as described above with respect to FIGS. 3 and 4. However, in some examples, the microchip 124 shown and described in FIG. 7 may be partially or entirely encapsulated by a sealant (or other sealant).

The plug 700 further includes a heat sink 722 that is inserted into the cavity 714. In some examples, the heat sink 722 may include threading that corresponds with threading of the sidewall 716 such that the heat sink 722 may be inserted and maintained within the cavity 714 of the plug 700. However, in some examples, the heat sink 722 may be adhered to the sidewall 716 of the cavity 714 via an adhesive. The adhesive may include an acrylic adhesive, epoxy (one-part or two-part epoxy), polyurethane reactive adhesives, urethane adhesives, anaerobic adhesives, instant adhesives (e.g., cyanoacrylates), etc. In some examples, the adhesive is selected to be able to withstand temperatures up to and/or exceeding 150° C. In some examples, the heat sink 722 may be attached to the base 720 of the cavity 714 in addition to or instead of the sidewall 716. Furthermore, the heat sink 722 may be coupled to the plug 700 via mechanical fasteners, threading (as mentioned above), or other means in addition to or instead of an adhesive. In some examples, the heat sink 722 may include a metallic cartridge 723 that includes threading. The cartridge 723 may be removeable from the cavity 714 of the plug 700. Furthermore, the heat sink 722 may include metallic foam 724 that is coupled the cartridge 723. Additionally, and/or alternatively, the heat sink 722 may include other materials that are attached to the cartridge 723. Such a material may include thermal properties such that the heat sink 722 draws heat away from the microchip 124. Additionally, and/or alternatively, the metallic foam 724 may be omitted and the microchip 124 may be insulated by an insulating material. In such an example, each side of the microchip 124 may be insulated. However, in some examples, less than each side of the microchip 124 may be insulated with an insulating material.

In some examples, the microchip 124 is coupled to the metallic foam 724 of the heat sink 722 via an adhesive. The adhesive used to couple the microchip 124 to the heat sink 722 may include an acrylic adhesive, epoxy (one-part or two-part epoxy), polyurethane reactive adhesives, urethane adhesives, anaerobic adhesives, instant adhesives (e.g., cyanoacrylates), etc. In some examples, the adhesive is selected to be able to withstand temperatures up to and/or exceeding 150° C.

The plug 700 may further include a first wire 725 that is electrically connected to a first terminal 726. The first terminal 526 may be mounted to a PCB (or other substrate) or the first terminal 726 may be formed by the PCB (or other substrate). The first terminal 726 on the microchip 124 includes leads connecting the first terminal 726 to the microchip 124 and/or other components on the substrate (e.g., the processor 130, the memory 126, etc.). In some examples, the first wire 725 is connected to the first terminal 726 prior to an adhesive being applied to the microchip 124 such that the adhesive forms around the first wire 725. The first wire 725 passes through the heat sink 722 and electronically couples the microchip 124 to the ECM 134 or other device. In some examples, the heat sink 722 and the plug 700 include holes that are drilled or otherwise formed therein, allowing the first wire 725 to pass therethrough. As mentioned previously, the ECM 134 (or other device) sends a voltage signal to the microchip 124 via the first wire 725 when an event occurs (e.g., engine startup, engine shutdown, etc.). In response, the microchip 124 transmits information to the ECM 134 via the first wire 725. The ECM 134 may record such information and generate timestamp data from the information transmitted from the microchip 124. The plug 700 also includes a second wire 728 that grounds the microchip 124 to the body 702 of the plug 700 or other portion of the turbocharger 100. In some examples, the second wire 728 is connected to a second terminal 730. The second terminal 730 includes leads connecting the second terminal 730 to the microchip 124 and/or other components mounted on the substrate (e.g., the processor 130, the memory 126, etc.).

Figure 8:
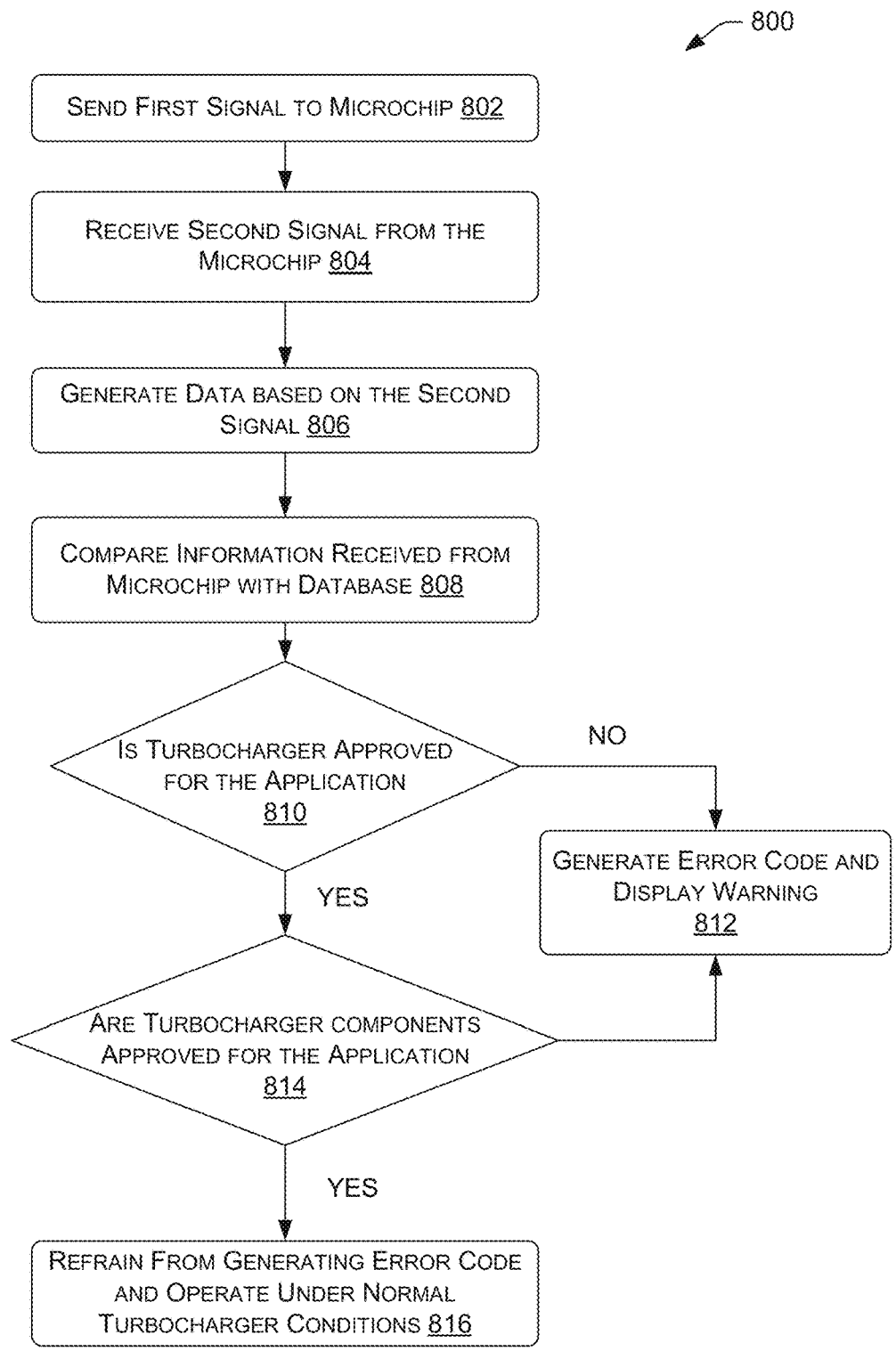
FIG. 8 is a flowchart illustrating a method of tracking usage of a turbocharger in accordance with an example of the present disclosure.

FIG. 8 depicts an example method 800 of tracking usage of a turbocharger 100. The example method 800 is illustrated as a collection of steps in a logical flow diagram, which represents operations that may be implemented in hardware, software, or a combination thereof. In the context of software, the steps represent computer-executable instructions stored in memory. Such computer-executable instructions may include routines, programs, objects, components, data structures, and the like that perform particular functions or implement particular abstract data types. The order in which the operations are described is not intended to be construed as a limitation, and any number of the described steps may be combined in any order and/or in parallel to implement the process. For discussion purposes, and unless otherwise specified, the method 800 is described with reference to the turbocharger 100 and the plug 122 having the microchip 124 coupled thereto, and/or other components shown in FIGS. 1-7. In particular and unless otherwise specified, the method 800 will be described with respect to the ECM 134 for ease of description.

At 802, the ECM 134 sends a first signal to the microchip 124. The signal may include a voltage signal that the ECM 134 sends to the microchip 124 when an event occurs. Such an event may include engine startup, engine shutdown, a maintenance event, etc. In some examples, the ECM 134 may automatically send the first signal to the microchip 124 (at engine startup and/or engine shutdown). Additionally, and/or alternatively, a user may interact with the ECM 134 via an interface, thereby causing the ECM 134 to send the first signal to the microchip 124 (at maintenance events or other events in a life cycle of the turbocharger). In some examples, the first signal causes the processor 130 of the microchip 124 to retrieve information (e.g., part number and serial number of turbocharger 100 and/or components thereof) stored in the memory 126 of the microchip 124. Once the processor 130 retrieves the information from the memory 126, the processor 130 is configured to send a second signal to the ECM 134 that includes the information.

At 804, the ECM 134 receives the second signal from the microchip 124. As mentioned previously, the microchip 124 may be a passive device that is configured to return a signal to the ECM 134 with specific information/data upon receipt of a signal from the ECM 134. The second signal may include information regarding the turbocharger 100 and/or various components thereof. For example, the second signal may transmit data indicating a serial number and/or part number of the turbocharger 100 and/or the components thereof. In some examples, the second signal may include an encrypted certificate (or multiple certificates) indicating that the turbocharger 100 and/or the various components thereof are authentic components. Furthermore, the second signal may transmit a unique identification number that denotes a part number and/or a serial number of the turbocharger 100.

At 806, the ECM 134 generates data based at least in part on the second signal received from the microchip 124. For example, the ECM 134 may generate timestamp data from the information/data received in the second signal. The timestamp data may include the serial number and/or part number of the turbocharger 100 and/or the various components thereof, the certificate(s) of the turbocharger 100 and/or the various components thereof, a date and/or time of the event. The ECM 134 may further generate event data indicating a type of event that occurred (e.g., engine startup, engine shutdown, turbocharger maintenance, turbocharger inspection, etc.). The ECM 134 may determine the type of event that occurred based on data received from one or more other components or systems (e.g., ignition, steering system, fuel system, etc.) of a particular application in which the ECM 134 is incorporated.

At 808, the ECM 134 compares the information received from the microchip 124 with a database accessible by the ECM 134. In some examples, the ECM 134 may store information related to the turbocharger 100 in the memory 136 of the ECM 134 and may access such data from the memory 136. Additionally, and/or alternatively, the ECM 134 may access a remote database that stores the data via the network interface(s) 138. For example, the ECM 134 may access an approved list stored in the database that indicates one or more turbochargers and/or components thereof that are approved for the application for which the turbocharger 100 is installed. The ECM 134 may determine whether the information received from the turbocharger 100 matches one or more entries on the approved list. For example, the ECM 134 may determine from the information whether the turbocharger 100 is an authentic turbocharger 100 or if the turbocharger 100 is an aftermarket alternative. In some examples, aftermarket alternatives may negatively impact the performance of an application on which the turbocharger 100 is installed. Thus, authenticating the turbocharger 100 may be necessary to ensure performance of the application for which the turbocharger is implemented.

At 810, the ECM 134 determines whether the turbocharger 100 is approved for the application. For example, based on comparing the information related to the turbocharger 100 with the approved list, the ECM 134 determines whether the turbocharger 100 is approved for the application (i.e., whether the turbocharger 100 is an authentic component, whether the turbocharger 100 meets requirements of the specific application, etc.). At 810—No, the ECM 134 may, at 812, generate an error code and display a warning on a display associated with the machine on which the turbocharger 100 is installed (e.g. control stand, dashboard, control panel. etc.). The error code and/or the warning may indicate that the turbocharger 100 is not approved for the specific application on which the turbocharger 100 is installed.

If, however, at 810—Yes the ECM 134 determines that the turbocharger is approved for the application, the ECM 134 may, at 814, determine whether one or more components of the turbocharger 100 are approved for the application. Turbocharger aftermarket rebuild and remanufacture alternatives are readily available. However, such aftermarket alternatives may harm the performance of the turbocharger 100 and/or may damage the turbocharger 100 and/or other components of the engine on which the turbocharger 100 is installed, thereby creating additional problems and cost to repair. Thus, the ECM 134 may determine, at 814, from the information received from the microchip 124 whether the components currently installed on the turbocharger 100 are approved for the application on which the turbocharger is installed. For example, the ECM 134 may access an approved list stored in the database that indicates approved components for the turbocharger 100 that are approved for the turbocharger 100 and/or for the application for which the turbocharger 100 is installed. The ECM 134 may determine whether the information received from the turbocharger 100 matches one or more entries on the approved list.

If, at 814—No, the ECM 134 determines that one or more of the components are not approved for the application by comparing the information related to the components of the turbocharger with the approved list, the ECM 134 generates an error code and displays a warning on a display associated with the machine on which the turbocharger 100 is installed (e.g. control stand, dashboard, control panel. etc.). The error code and/or the warning may indicate that the turbocharger 100 and/or one or more components of the turbocharger 100 are not approved for the specific application on which the turbocharger 100 is installed.

If, however, at 814—Yes the ECM 134 determines that the turbocharger 100 components are approved for the application, the ECM 134 refrains from generating the error code and/or displaying a warning and operates under normal operating conditions at 816.

Figure 9:
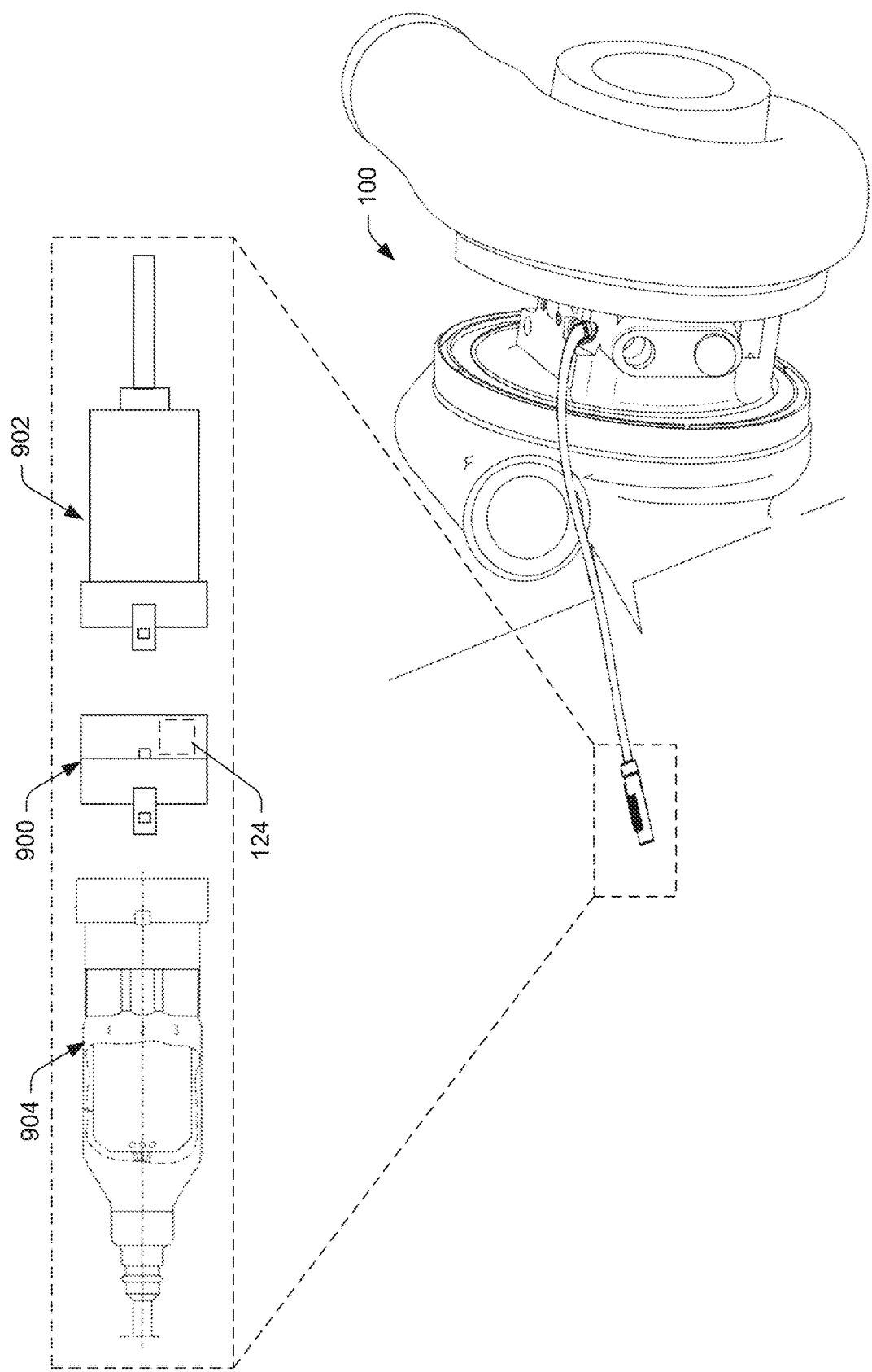
FIG. 9 is a schematic diagram of an example chip adapter assembly having a microchip in accordance with an example of the present disclosure.

FIG. 9 depicts a schematic diagram of an example chip adapter assembly 900 having a microchip 124 included therein. In some examples, the chip adapter assembly 900 is configured to be inserted between an engine wire harness 902 and a turbocharger speed harness 904. In such examples, the microchip 124 may be electronically and/or communicatively coupled to the engine wire harness 902 and/or the turbocharger speed harness 904. For example, the engine wire harness 902 may communicate a voltage signal sent from the ECM 134 (or other device) when an event occurs (e.g., engine startup, engine shutdown, etc.). In response, the microchip 124 transmits information to the ECM 134 via the engine wire harness 902. The ECM 134 may record such information and generate timestamp data from the information transmitted from the microchip 124. Furthermore, the turbocharger speed harness 904 may provide information via voltage signals regarding turbocharger 100 performance.

INDUSTRIAL APPLICABILITY

The present disclosure describes a microchip 124 that is mounted on a plug 122 configured to be inserted into a housing of an engine component. Such an engine component includes a turbocharger 100. The plug 122 is inserted into a housing of the turbocharger 100 such that the microchip 124 is located within a water jacket or other coolant liquid housing. In some examples, the microchip 124 is at least partially submerged in coolant liquid when the plug 122 is inserted into the turbocharger 100 housing. The microchip 124 is configured to store information about the turbocharger 100 and is configured to transmit such information to an engine control module (ECM) 134 when the microchip 124 receives a signal from the ECM 134. In some examples, the microchip 124 is mounted on a heat sink 302 configured to draw heat away from the microchip 124. In one configuration, the microchip 124 is mounted on an end of the plug 122. However, in another configuration, the microchip 124 is coupled to the plug 400 in an interior space of the plug 122 that forms a cavity 412. In either configuration, the microchip 124 is at least partially sealed with a sealant 306 or other packaging material. Such configurations provide a microchip 124 that resides within a turbocharger 100 central housing 106 in order to cool the microchip 124, while the microchip 124 is electronically and communicatively connected to the ECM 134. Therefore, a life of the turbocharger 100 and its components can be accurately tracked.

While aspects of the present disclosure have been particularly shown and described with reference to the embodiments above, it will be understood by those skilled in the art that various additional embodiments may be contemplated by the modification of the disclosed machines, systems and methods without departing from the spirit and scope of what is disclosed. Such embodiments should be understood to fall within the scope of the present disclosure as determined based upon the claims and any equivalents thereof.

What is claimed is:

1. A plug configured to be at least partially inserted into a central housing of a turbocharger, the plug comprising:
   a body having a first end, a second end opposite the first end, and a threaded portion extending from the second end to a location on the body between the first end and the second end;
   a heat sink coupled to the second end;
   a microchip mounted to a substrate that is coupled to the heat sink, the microchip configured to store information related to the turbocharger, wherein the microchip is at least partially submerged in coolant in the central housing when the plug is inserted into the central housing of the turbocharger; and
   a thermally resistant sealant that is applied to one or more sides of the microchip once the microchip is coupled to the heat sink.

2. The plug of claim 1, wherein the heat sink comprises a metallic foam that is configured to permit passage of the coolant at least partially therethrough.

3. The plug of claim 1, wherein the heat sink is coupled to the second end via an adhesive, and the substrate is coupled to the heat sink via the adhesive.

4. The plug of claim 1, further comprising a wire electrically connected to the microchip, the wire passing through the body of the plug and electronically coupling the microchip to an engine control module.

5. The plug of claim 1, wherein the body of the plug includes an interior space forming a cavity having a single opening, and the microchip is at least partially disposed within the cavity, the interior space being formed by a sidewall of the body of the plug.

6. The plug of claim 1, wherein the information includes at least a serial number and a part number of the turbocharger.

7. The plug of claim 1, wherein the microchip includes programmable memory configured to store the information.

8. The plug of claim 1, wherein the first end includes a shoulder that abuts an exterior surface of the central housing when the plug is inserted into the central housing.

9. A turbocharger, comprising:
   a housing having at least one fluid passage through which a flow of coolant passes through the housing, the housing including a port fluidly connected to the fluid passage; and
   a plug secured to the housing with at least a portion of the plug being inserted into and fluidly sealing the port of the housing, the plug comprising:
      a body including a first end and a second end opposite the first end; and a microchip located on a substrate that is coupled to the second end, the microchip being configured to store information related to the turbocharger, wherein the microchip is at least partially submerged in the coolant in the housing.

10. The plug of claim 9, wherein the housing is a central housing coupled to a turbine housing and a compressor housing.

11. The plug of claim 9, wherein the body further includes a threaded portion extending from the second end to a location between the first end and the second end, the threaded portion of the body corresponding with threading of the port in the turbocharger.

12. The plug of claim 9, wherein the information is encrypted and stored in programmable memory on the microchip, the information including at least a serial number and a part number of the turbocharger.

13. The plug of claim 9, further comprising metallic foam located between the second end and the microchip, wherein the metallic foam is coupled to the second end via an adhesive and the substrate is coupled to the metallic foam via the adhesive.

14. The plug of claim 9, wherein the microchip is electronically coupled to an engine control module via a wire that passes through the body of the plug.

15. The plug of claim 14, wherein the microchip includes a processor that is configured to:
 receive a first voltage signal from the engine control module when an event occurs;
 retrieve the information from memory included on the microchip; and
 send a second voltage signal to the engine control module at least partially in response to receiving the first voltage signal, the second voltage signal including the information.

16. A turbocharger, comprising:
 a central housing having at least one fluid passage directing a flow of coolant through the central housing, the central housing including a port fluidly connected to the fluid passage;
 a turbine housing coupled to the central housing;
 a compressor housing coupled to the central housing; and
 a plug coupled to the central housing with at least a portion of the plug being inserted into and fluidly sealing the port of the housing, the plug including:
  a body having a first end, a second end opposite the first end, and a threaded portion located between the first end and the second end;
  a metallic foam component coupled to the second end;
  a printed circuit board coupled to the metallic foam component, the printed circuit board including a microchip configured to store information associated with the turbocharger, wherein at least part of the microchip is disposed within the fluid passage when the plug is coupled to the central housing; and
  a wire electronically coupling the microchip to an electronic control module, the wire passing through the body of the plug.

17. The turbocharger of claim 16, wherein the threaded portion includes external threading configured to correspond with threading in a port in the central housing.

18. The turbocharger of claim 16, wherein the microchip is at least partially encapsulated with sealant.

19. The turbocharger of claim 16, further comprising a turbocharger speed harness coupled to the turbocharger and configured to send turbocharger data to an engine control module via an engine wire harness that is connected to and communicatively coupled to the turbocharger speed harness, wherein the microchip is located in a chip adapter assembly configured to be inserted between the turbocharger speed harness and the engine wire harness.

* * * * *